United States Patent
Sugiura et al.

(10) Patent No.: US 10,505,500 B2
(45) Date of Patent: Dec. 10, 2019

(54) DIFFERENTIAL AMPLIFICATION DEVICE

(71) Applicant: ABLIC Inc., Chiba-shi, Chiba (JP)

(72) Inventors: Masakazu Sugiura, Chiba (JP); Toshiyuki Tsuzaki, Chiba (JP); Yuji Shiine, Chiba (JP); Manabu Fujimura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/939,987

(22) Filed: Mar. 29, 2018

(65) Prior Publication Data

US 2018/0287567 A1    Oct. 4, 2018

(30) Foreign Application Priority Data

Mar. 31, 2017   (JP) .................................. 2017-072215

(51) Int. Cl.
*H03F 3/45* (2006.01)
*H03F 1/26* (2006.01)
*H03F 3/387* (2006.01)

(52) U.S. Cl.
CPC .............. *H03F 1/26* (2013.01); *H03F 3/387* (2013.01); *H03F 3/45* (2013.01); *H03F 3/45475* (2013.01); *H03F 3/45968* (2013.01); *H03F 2200/129* (2013.01); *H03F 2200/372* (2013.01); *H03F 2200/375* (2013.01)

(58) Field of Classification Search
CPC ........................................................ H03F 3/45
USPC ........................................................ 330/69, 9
See application file for complete search history.

(56) References Cited

U.S. PATENT DOCUMENTS

| | | | | |
|---|---|---|---|---|
| 8,120,422 | B1* | 2/2012 | Huijsing | H03F 1/083 327/124 |
| 2009/0273392 | A1* | 11/2009 | Korobeynikov | H03K 5/24 327/551 |
| 2010/0060352 | A1* | 3/2010 | Kusuda | H03F 3/45977 330/9 |
| 2014/0232456 | A1* | 8/2014 | Huijsing | H03F 1/56 330/9 |
| 2015/0357979 | A1* | 12/2015 | Ouchi | H03F 3/45192 330/9 |

FOREIGN PATENT DOCUMENTS

WO    WO 2006/093177 A1    9/2006

* cited by examiner

*Primary Examiner* — Henry Choe
(74) *Attorney, Agent, or Firm* — Brinks Gilson & Lione

(57) ABSTRACT

Provided is a differential amplification device reduced in DC offset voltage. The amplification device amplifies an input signal, and includes a chopper switch circuit which switches the polarity of the input signal between a normal phase and a reverse phase and outputs the input signal, a V-I conversion circuit which is connected to the chopper switch circuit, a capacitance circuit which is connected to the V-I conversion circuit to store electric charges supplied from the V-I conversion circuit, and an amplification circuit which is connected to the V-I conversion circuit to switch the polarity of an input signal between the normal phase and the reverse phase and amplify the input signal.

10 Claims, 7 Drawing Sheets

FIG. 5A   1T~2T
Φ1,Φ3:High
Φ2,Φ4:Low
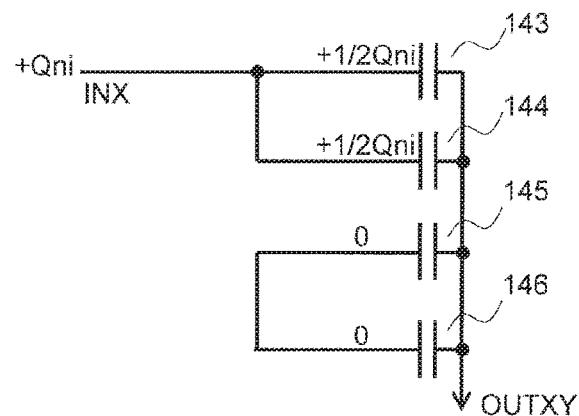
FIG. 5B   2T~3T
Φ2,Φ3:High
Φ1,Φ4:Low
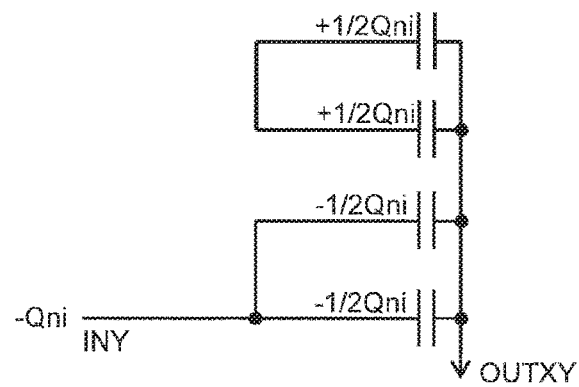
FIG. 5C   3T
Φ2,Φ4:High
Φ1,Φ3:Low
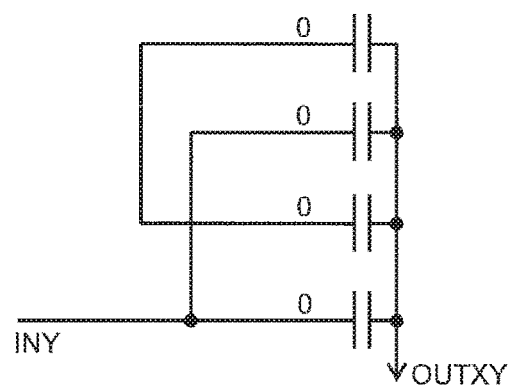

FIG. 6A  1T~2T
Φ1,Φ3:High
Φ2,Φ4:Low

FIG. 6B  2T~3T
Φ2,Φ3:High
Φ1,Φ4:Low

Φ2,Φ4:High
Φ1,Φ3:Low

DIFFERENTIAL AMPLIFICATION DEVICE

RELATED APPLICATIONS

This application claims priority under 35 U.S.C. § 119 to Japanese Patent Application No. 2017-072215 filed on Mar. 31, 2017, the entire content of which is hereby incorporated by reference.

BACKGROUND OF THE INVENTION

1. Field of the Invention

The present invention relates to a differential amplification device reduced in DC offset voltage.

2. Description of the Related Art

Hitherto, it has been known that fluctuations in characteristics among elements cause a DC offset voltage in a differential amplification device. The DC offset voltage refers to a generated non-zero output voltage despite the zero input voltage which is caused by, for example, a short circuit between input terminals of the differential amplification device. While a zero input voltage means a zero output voltage in an ideal differential amplification device, there are cases in which a slight output voltage is accidentally generated by fluctuations in characteristics and other manufacturing-related factors. It is known that the estimation of the DC offset voltage is carried out conveniently by converting it as an input voltage after dividing the DC offset voltage by the amplification factor of the amplification device (see, for example, WO 2006/093177). FIG. 12 is a circuit diagram for illustrating a differential amplification device 201 of the related art.

The differential amplification device 201 of the related art is described. The differential amplification device 201 of the related art includes input terminals 211 and 212, an output terminal 213, and a differential amplifier 221. The differential amplifier 221 amplifies a differential voltage Vsi which is a difference between the voltage of the positive input terminal and the voltage of the negative input terminal, and outputs the amplified differential voltage from the output terminal.

The voltage of the input terminal 211, the voltage of the input terminal 212, and the voltage of the output terminal 213 are given as V(211), V(212), and V(213), respectively. A signal voltage applied to the differential amplification device 201 of the related art (hereinafter denoted by "Vsi") is expressed as V(211)-V(212). The differential amplification device 201 of the related art operates so as to amplify the input voltage Vsi expressed as V(211)-V(212) and generate V(213).

In the differential amplification device 201 of the related art, a non-zero DC offset voltage appears as the output voltage when the input voltage to the amplifier is zero as described above. The DC offset voltage is converted into an input voltage denoted by Vni 231 which is inserted between the input terminal 211 and a positive input terminal of the amplifier 221 as illustrated in FIG. 12. The differential amplification device 201 of the related art amplifies Vni 231 as well as Vsi which is expressed as V(211)-V(212) and outputs the amplified voltage to V(213). When a minute signal such as an output signal from a sensor is handled, the S/N ratio to the minute signal input is ever more important.

SUMMARY OF THE INVENTION

The present invention has been made in view of the above and relates to an amplification device reduced in DC offset voltage, and an object of the present invention is to provide a differential amplification device improved in S/N ratio.

In view of the above, a differential amplification device according to one embodiment of the present invention has the following configuration. There is provided a differential amplification device, including: a chopper switch circuit configured to switch a polarity of an input signal between a normal phase and a reverse phase; a V-I conversion circuit configured to convert an output voltage of the chopper switch circuit into a current; a capacitance circuit connected to an output of the V-I conversion circuit; and an amplification circuit similarly connected to the output of the V-I conversion circuit, and is configured to switch a polarity of an input signal between the normal phase and the reverse phase.

According to the differential amplification device of the present invention, the amplification of the DC offset voltage is reduced, and a differential amplification device improved in signal-to-noise ratio can consequently be provided.

BRIEF DESCRIPTION OF THE DRAWINGS

FIG. 5A, FIG. 5B, and FIG. 5C are diagrams for illustrating an example of the operation of the capacitance circuit.

FIG. 6A, FIG. 6B, and FIG. 6C are diagrams for illustrating another example of the operation of the capacitance circuit.

DETAILED DESCRIPTION OF THE EMBODIMENTS

First Embodiment

Figure 1:
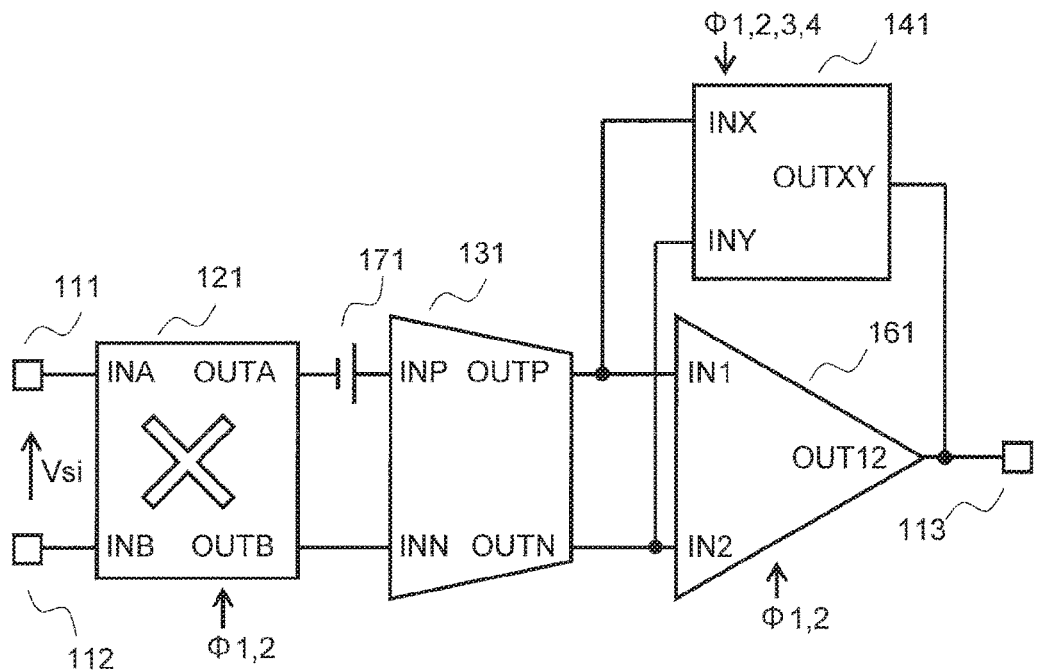
FIG. 1 is a block diagram for illustrating an example of an amplification device according to an embodiment of the present invention.

A first embodiment of the present invention is described below with reference to the drawings. FIG. 1 is a block diagram for illustrating an example of an amplification device according to the first embodiment of the present invention.

A differential amplification device 101 according to the first embodiment of the present invention which is illustrated in FIG. 1 includes input terminals 111 and 112, an output terminal 113, a chopper switch circuit 121, a V-I conversion circuit 131, a capacitance circuit 141, and an amplification circuit 161.

The input terminal 111 is connected to a terminal INA of the chopper switch circuit 121. The input terminal 112 is connected to a terminal INB of the chopper switch circuit 121. A terminal OUTA of the chopper switch circuit 121 is connected to a terminal INP of the V-I conversion circuit 131. A terminal OUTB of the chopper switch circuit 121 is connected to a terminal INN of the V-I conversion circuit 131. The DC offset voltage of the V-I conversion circuit 131 is converted into an input voltage denoted by Vni 171 which is inserted between the terminal OUTA of the chopper switch circuit 121 and the terminal INP of the V-I conversion circuit 131 as illustrated in FIG. 1. A terminal OUTP of the V-I conversion circuit 131 is connected to a terminal IN1 of the amplification circuit 161 and a terminal INX of the capacitance circuit 141. A terminal OUTN of the V-I conversion circuit 131 is connected to a terminal IN2 of the amplification circuit 161 and a terminal INY of the capacitance circuit 141. A terminal OUT12 of the amplification circuit 161 is connected to a terminal OUTXY of the capacitance circuit 141 and the output terminal 113.

Figure 2:
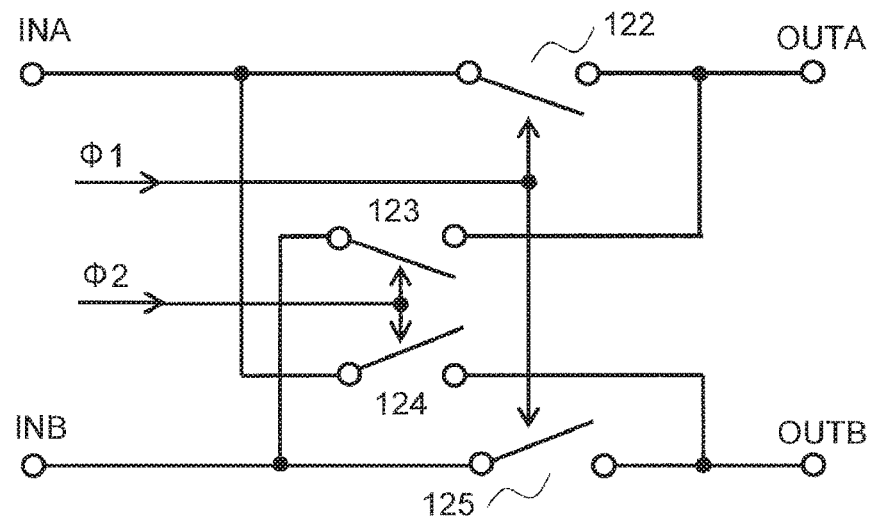
FIG. 2 is a circuit diagram for illustrating an example of a chopper switch circuit.

The chopper switch circuit 121 is described with reference to FIG. 2. The chopper switch circuit 121 of FIG. 2 includes the terminals INA, INB, OUTA, and OUTB, switches 122 and 125 which are switched on/off by a clock signal Φ1, and switches 123 and 124 which are switched on/off by a clock signal Φ2. The terminal INA is connected to the terminal OUTA by the switch 122, and is connected to the terminal OUTB by the switch 124. The terminal INB is connected to the terminal OUTA by the switch 123, and is connected to the terminal OUTB by the switch 125.

Figure 11:
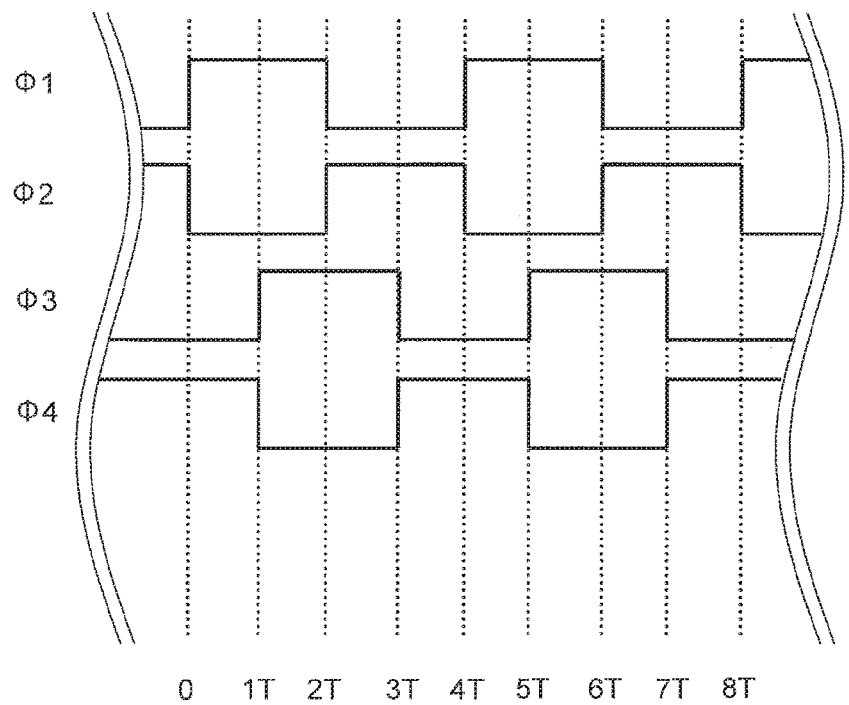
FIG. 11 is a diagram for illustrating an example of clock signals in the amplification devices according to the embodiments of the present invention.
Figure 12:
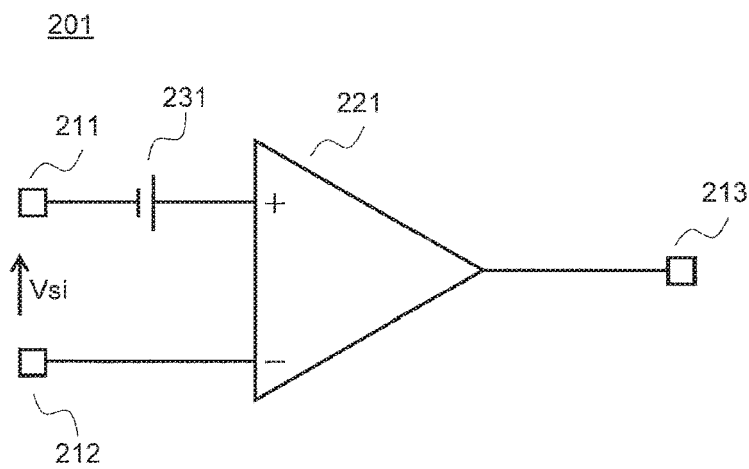
FIG. 12 is a circuit diagram for illustrating an amplification device of the related art.

The operation of the chopper switch circuit 121 is described next. Clock signals illustrated in FIG. 11 are applied to the chopper switch circuit 121. In a period from 0 to 2T, the clock signal Φ1 is high and the clock signal Φ2 is low which means that the switches 122 and 125 are switched on while the switches 123 and 124 are switched off. Electrical connection is established between the terminal INA and the terminal OUTA, and between the terminal INB and the terminal OUTB (hereinafter referred to as "normal phase state"). In a period from 2T to 4T, the clock signal Φ1 is low and the clock signal Φ2 is high which means that the switches 122 and 125 are switched off while the switches 123 and 124 are switched on. Electrical connection is established between the terminal INA and the terminal OUTB, and between the terminal INB and the terminal OUTA (hereinafter referred to as "reverse phase state").

The V-I conversion circuit 131 is described. The V-I conversion circuit 131 includes the terminals INP, INN, OUTP, and OUTN. The V-I conversion circuit 131 converts a voltage into a current and outputs the current. The voltage of the terminal INP and the voltage of the terminal INN are given as V(INP) and V(INN), respectively. When a differential input voltage V(INP)-V(INN) is positive, a higher differential input voltage means a larger outgoing current flow out of the terminal OUTP and a larger incoming current flow from the terminal OUTN. When the input differential voltage V(INP)-V(INN) is negative, a higher absolute value of the input differential voltage means a larger incoming current flow from the terminal OUTP and a larger outgoing current flow out of the terminal OUTN.

As described above, the DC offset voltage (Vni 171) of the V-I conversion circuit 131 is converted into an input voltage illustrated in FIG. 1 and inserted between the terminal OUTA of the chopper switch circuit 121 and the terminal INP of the V-I conversion circuit 131. A differential amplifier such as the V-I conversion circuit 131 is usually used with a negative feedback applied to the differential amplifier, and input terminals of the differential amplifier are in an imaginary short circuit state. The DC offset voltage accordingly has significant effect on the output of the V-I conversion circuit 131.

Figure 3:
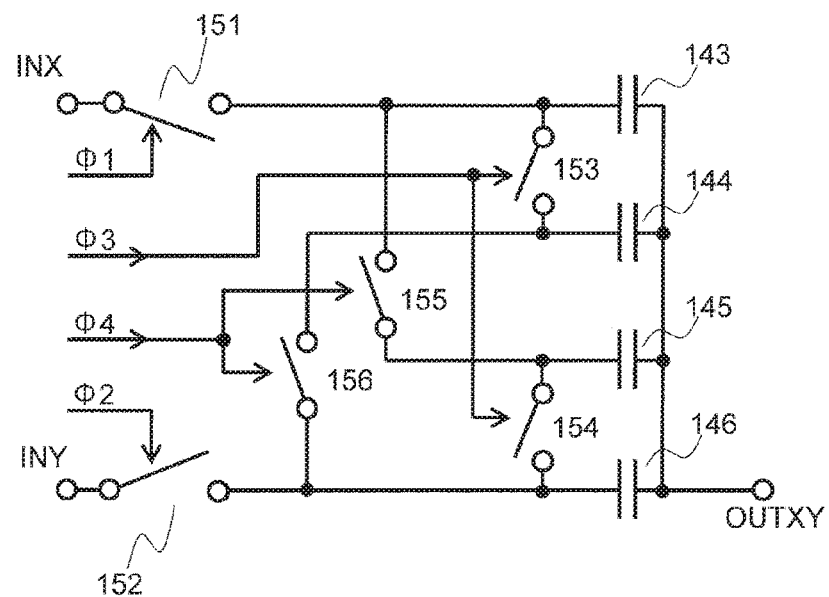
FIG. 3 is a circuit diagram for illustrating an example of a capacitance circuit.

The capacitance circuit 141 is described with reference to FIG. 3. The capacitance circuit 141 includes capacitors 143, 144, 145, and 146, a switch 151 which is switched on/off by the clock signal Φ1, a switch 152 which is switched on/off by the clock signal Φ2, switches 153 and 154 which are switched on/off by a clock signal Φ3, switches 155 and 156 which are switched on/off by a clock signal Φ4, and the terminals INX, INY, and OUTXY. Connections within the capacitance circuit 141 are described. The terminal INX is connected to a first terminal of the switch 151. A second terminal of the switch 151 is connected to a first terminal of the switch 153, a first terminal of the switch 155, and a first terminal of the capacitor 143. A second terminal of the switch 153 is connected to a second terminal of the switch 156 and a first terminal of the capacitor 144. A second terminal of the switch 155 is connected to a second terminal of the switch 154 and a first terminal of the capacitor 145. The terminal INY is connected to a first terminal of the switch 152. A second terminal of the switch 152 is connected to a first terminal of the switch 154, a first terminal of the switch 156, and a first terminal of the capacitor 146. Second terminals of the capacitors 143 to 146 are connected to the terminal OUTXY.

The operation of the capacitance circuit 141 is described next. The clock signals illustrated in FIG. 11 are applied to the capacitance circuit 141. In a period from 0 to 1T, the clock signal Φ1 is high, the clock signal Φ2 is low, the clock signal Φ3 is low, and the clock signal Φ4 is high which means that the switches 151, 155, and 156 are switched on while the switches 152, 153, and 154 are switched off. With the clock signal Φ1 set to high, a signal in the normal phase state is applied. Electric charges are stored in the capacitors 143 and 145 via the terminal INX.

In a period from 1T to 2T, the clock signal Φ1 is high, the clock signal Φ2 is low, the clock signal Φ3 is high, and the clock signal Φ4 is low which means that the switches 151, 153, and 154 are switched on while the switches 152, 155, and 156 are switched off. The capacitor 143 and the capacitor 144 are connected to each other by the switch 153, and electric charges stored in the capacitor 143 are re-distributed equally between the capacitor 143 and the capacitor 144. Similarly, the capacitor 145 and the capacitor 146 are connected to each other by the switch 154, and electric charges stored in the capacitor 145 are re-distributed equally between the capacitor 145 and the capacitor 146. Electric charges are stored in the capacitors 143 and 144 via the terminal INX.

In a period from 2T to 3T, the clock signal Φ1 is low, the clock signal Φ2 is high, the clock signal Φ3 is high, and the clock signal Φ4 is low which means that the switches 152, 153, and 154 are switched on while the switches 151, 155, and 156 are switched off. Electric charges are stored in the capacitors 145 and 146 via the terminal INY.

In a period from 3T to 4T, the clock signal Φ1 is low, the clock signal Φ2 is high, the clock signal Φ3 is low, and the clock signal Φ4 is high which means that the switches 152, 155, and 156 are switched on while the switches 151, 153, and 154 are switched off. The capacitor 143 and the capacitor 145 are connected to each other by the switch 155, and electric charges stored in the capacitor 143 and the capacitor 145 are re-distributed equally between the capacitor 143 and the capacitor 145. Similarly, the capacitor 144 and the capacitor 146 are connected to each other by the switch 156, and electric charges stored in the capacitor 144 and the capacitor 146 are re-distributed equally between the capacitor 144 and the capacitor 146. Electric charges are stored in the capacitors 144 and 146 via the terminal INY. The capacitance circuit 141 repeats the described operation.

Figure 7:
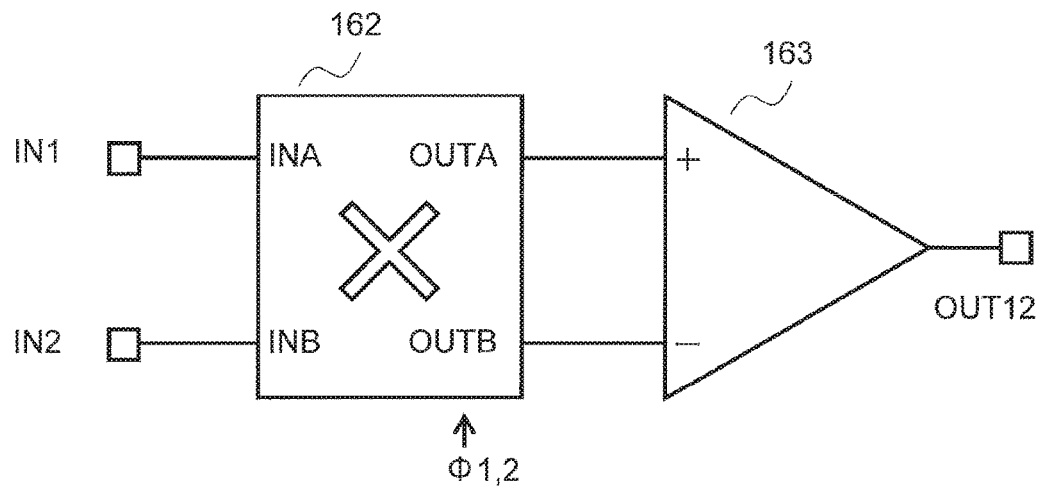
FIG. 7 is a block diagram for illustrating an example of an amplification circuit.

The amplification circuit 161 is described with reference to FIG. 7. The amplification circuit 161 includes the terminals IN1, IN2, and OUT12, a chopper switch circuit 162, and a differential amplifier 163. The terminal IN1 is connected to a terminal INA of the chopper switch circuit 162. The terminal IN2 is connected to a terminal INB of the chopper switch circuit 162. A terminal OUTA of the chopper switch circuit 162 is connected to a positive input terminal of the differential amplifier 163. A terminal OUTB of the chopper switch circuit 162 is connected to a negative input terminal of the differential amplifier 163. The internal configuration of the chopper switch circuit 162 is the same as that of the chopper switch circuit 121 illustrated in FIG. 2, and a description on the internal configuration is therefore omitted. The chopper switch circuit 162 switches the input-side connection and the output-side connection by the clock signal Φ1 and the clock signal Φ2 in synchronization with the above-mentioned chopper switch circuit 121. The chopper switch circuit 162 is in the normal phase state when the chopper switch circuit 121 is in the normal phase state, and is in the reverse phase state when the chopper switch circuit 121 is in the reverse phase state. All input signals are accordingly supplied in the normal phase state. The differential amplifier 163 amplifies a differential voltage that is a difference between a positive input and a negative input, and outputs the amplified differential voltage to OUT12. The capacitors in the capacitance circuit 141 are connected between the input and output of the differential amplifier 163, and accordingly operate as phase compensation capacitors of the differential amplifier 163 as well.

The overall operation of the differential amplification device 101 is described. An input voltage applied between the input terminals 111 and 112 is put into the normal phase and the reverse phase alternatingly by the chopper switch circuit 121 which is switched by the clock signals Φ1 and Φ2. In this state, the input voltage is applied to the capacitance circuit 141 and the amplification circuit 161 which are switched by the clock signals Φ1 and Φ2, via the V-I conversion circuit 131 in which a DC offset voltage is generated. The input voltage is transmitted in synchronization with the clock signals Φ1 and Φ2, is put into the normal phase state in the amplification circuit 161, and then is supplied to the output terminal 113. The DC offset voltage generated in the downstream of the chopper switch circuit 121 is applied to the capacitance circuit 141 without being switched by the clock signals Φ1 and Φ2, is stored in the capacitors 143 to 146 inside the capacitance circuit while being switched by the clock signals Φ1 and Φ2, and is cancelled out at the time of switching of the clock signals Φ3 and Φ4.

A detailed description is given on the operation of cancelling out the DC offset voltage with reference to FIG. 5A to FIG. 5C. FIG. 5A to FIG. 5C are diagrams for illustrating how electric charges Qni which are obtained by V-I conversion of a DC offset voltage Vni, are stored in the capacitance circuit 141. FIG. 5A is an illustration of the operation in a period from 1T to 2T, in which the clock signals Φ1 and Φ3 are high, the clock signals Φ2 and Φ4 are low, switches relevant to the high clock signals are switched on, and switches relevant to the low clock signals are switched off. Electric charges +Qni are supplied from the terminal INX, and a half of +Qni is stored in the capacitor 143 and the capacitor 144 each. FIG. 5B is an illustration of the operation in a period from 2T to 3T in which the clock signals Φ2 and Φ3 are high the clock signals Φ1 and Φ4 are low, switches relevant to the high clock signals are switched on, and switches relevant to the low clock signals are switched off. Electric charges −Qni are supplied from the terminal INY, and a half of −Qni is stored in the capacitor 145 and the capacitor 146 each. FIG. 5C is an illustration of the operation at 3T in which the clock signals Φ2 and Φ4 are switched to high the clock signals Φ1 and Φ3 are switched to low, switches relevant to the high clock signals are switched on, and switches relevant to the low clock signals are switched off. The capacitor 143 and the capacitor 145 are connected by a switch and the capacitor 144 and the capacitor 146 are connected by a switch, thereby extinguishing the stored electric charges.

Figure 6C:
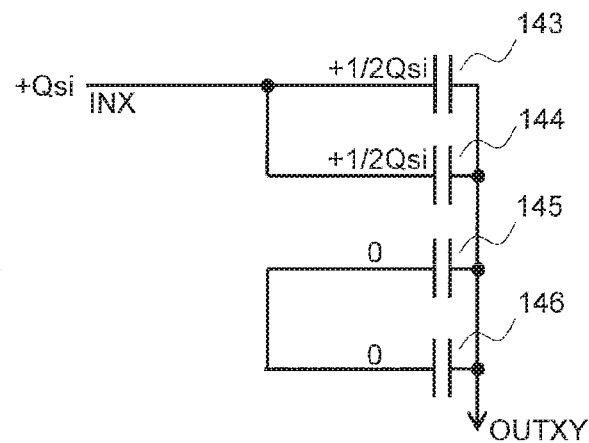
Figure 6C:
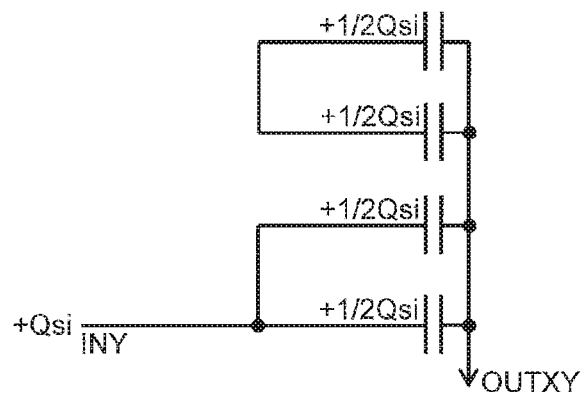
Figure 6C:
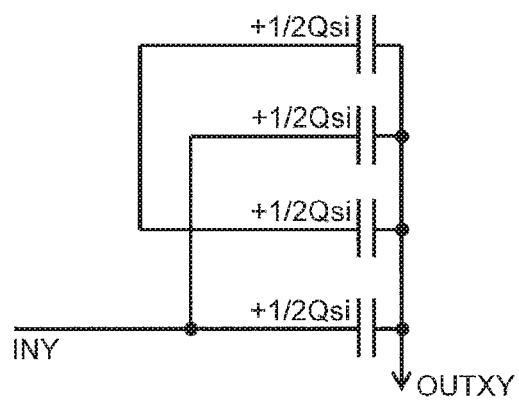

Electric charges resulting from an inter-input terminal voltage are described similarly with reference to FIG. 6A to FIG. 6C. The differential amplification device is usually used with a negative feedback applied thereto, which leads to an imaginary short circuit between the input terminals, as described above, and no electric charges are consequently generated from an inter-input terminal voltage. However, a voltage is generated between the input terminals when the input voltage is boosted by a voltage follower circuit, for example. FIG. 6A to FIG. 6C are diagrams for illustrating how electric charges Qsi which are obtained by performing V-I conversion on the inter-input terminal voltage Vsi at the same timing as in FIG. 5A to FIG. 5C are stored in the capacitance circuit 141. FIG. 6A is an illustration of the operation in a period from 1T to 2T, in which the clock signals Φ1 and Φ3 are high, the clock signals Φ2 and Φ4 are low, switches relevant to the high clock signals are switched on, and switches relevant to the low clock signals are switched off. Electric charges +Qsi are supplied from the terminal INX, and a half of +Qsi is stored in the capacitor 143 and the capacitor 144 each. FIG. 6B is an illustration of the operation in a period from 2T to 3T, in which the clock signals Φ2 and Φ3 are high, the clock signals Φ1 and Φ4 are low, switches relevant to the high clock signals are switched on, and switches relevant to the low clock signals are switched off. Electric charges having the same polarity as that of the terminal INX are supplied to the terminal INY because the inter-input terminal voltage is switched in the chopper switch circuit 121. The electric charges +Qsi are supplied from the terminal INX, and a half of +Qsi is stored in the capacitor 145 and the capacitor 146 each. FIG. 6C is an illustration of the operation at 3T, in which the clock signals Φ2 and Φ4 are switched to high, the clock signals Φ1 and Φ3 are switched to low, switches relevant to the high clock signals are switched on, and switches relevant to the low clock signals are switched off. The capacitor 143 and the capacitor 145 are connected by a switch, and the capacitor 144 and the capacitor 146 are connected by a switch, but the stored electric charges are not extinguished.

As described above, only an output resulting from the inter-input terminal voltage appears at the output terminal in the differential amplification device according to the first embodiment, and an output resulting from the DC offset voltage does not appear at the output terminal. The obtained differential amplification device is accordingly reduced in DC offset voltage and improved in S/N ratio.

Second Embodiment

Figure 8:
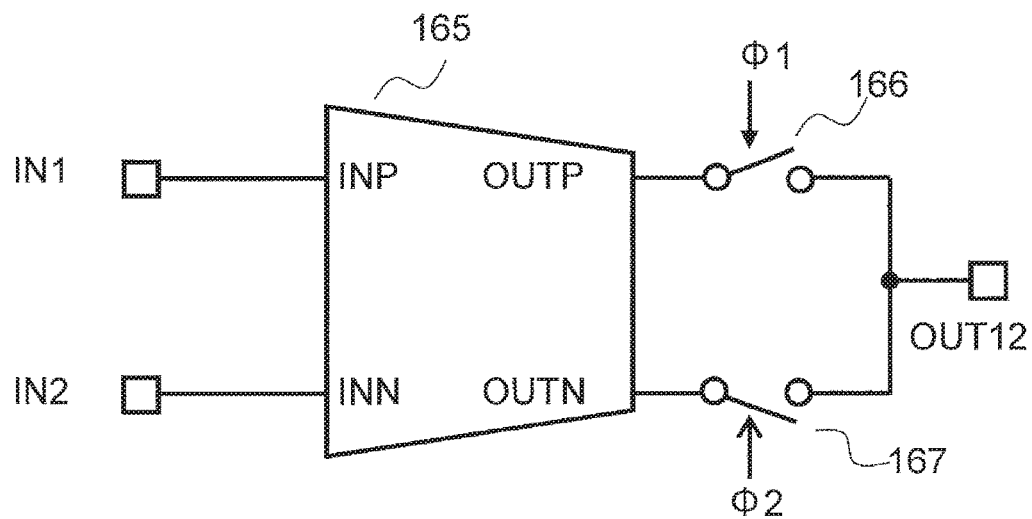
FIG. 8 is a block diagram for illustrating another example of the amplification circuit.

A second embodiment of the present invention is described below. The amplification circuit 161 of the first embodiment is an amplification circuit 164 in the second embodiment. FIG. 8 is a diagram for illustrating an example of the configuration of the amplification circuit 164 in the second embodiment. The amplification circuit 164 of FIG. 8 includes terminals IN1, IN2, and OUT12, a differential amplifier 165, a switch 166 switched on/off by the clock signal Φ1, and a switch 167 switched on/off by the clock signal Φ2. The terminal IN1 is connected to an input INP of the differential amplifier 165. The terminal IN2 is connected to an input INN of the differential amplifier 165. The switch 166 switched on/off by the clock signal Φ1 is connected between the terminal OUT12 and OUTP of the differential amplifier 165. The switch 167 switched on/off by the clock signal Φ2 is connected between the terminal OUT12 and OUTN of the differential amplifier 165. The switches 166 and 167 are switched by the clock signals Φ1 and Φ2 in synchronization with the chopper switch circuit 121 which means that all input signals that are applied to the amplification circuit 164 and are switched between the normal phase and the reverse phase are supplied to the terminal OUT12 in the normal phase state.

The same V-I conversion circuit 131, capacitance circuit 141, and output terminal 113 as those in the first embodiment are connected to the amplification circuit 164 of the second embodiment. A differential amplification device reduced in DC offset voltage and improved in S/N ratio can be obtained as in the first embodiment.

Third Embodiment

Figure 4:
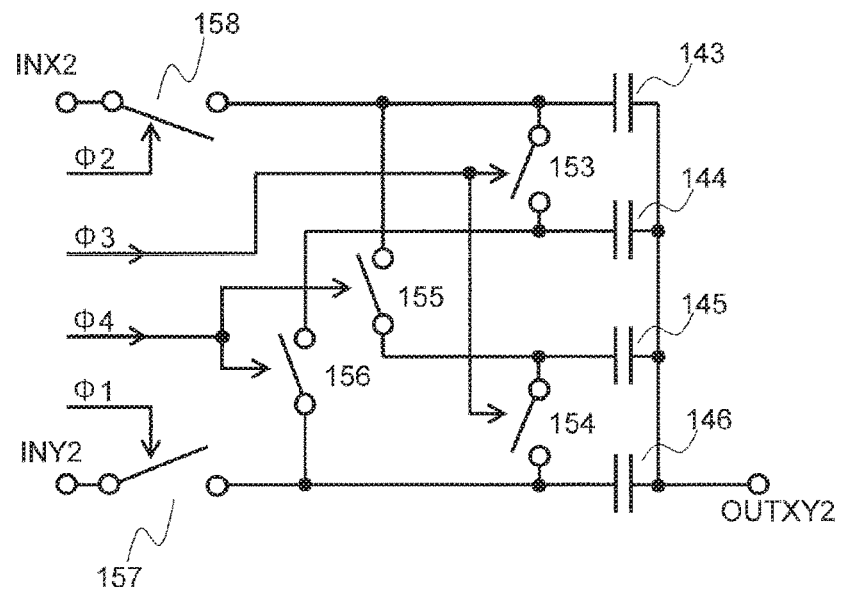
FIG. 4 is a circuit diagram for illustrating another example of the capacitance circuit.
Figure 9:
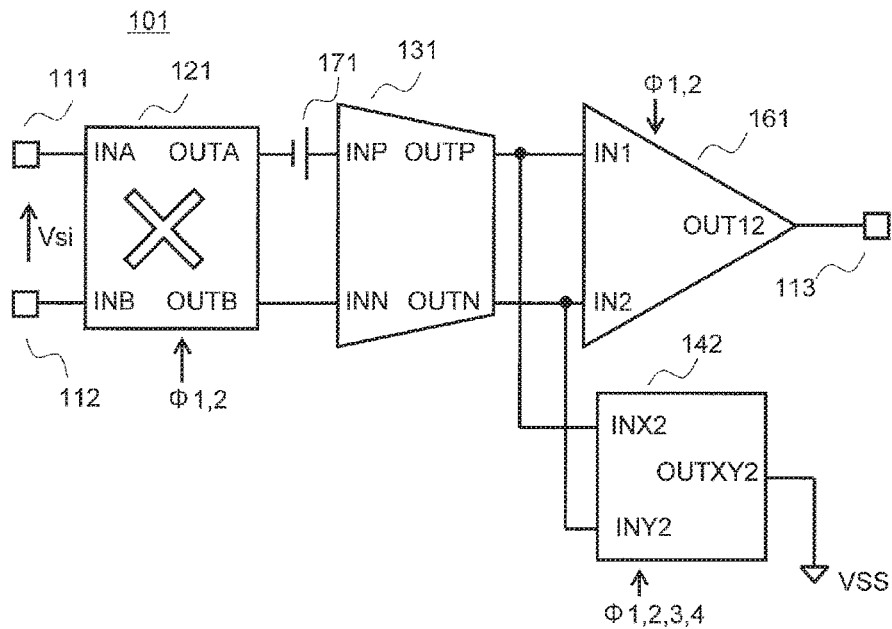
FIG. 9 is a block diagram for illustrating an example of an amplification device according to another embodiment of the present invention.

A third embodiment of the present invention is described below with reference to the drawings. FIG. 9 is a block diagram for illustrating an example of a differential amplification device according to the third embodiment of the present invention. A capacitance circuit 142 which has the same function as that of the capacitance circuit 141, is included in the third embodiment as illustrated in FIG. 9. The capacitance circuit 141 is different from the capacitance circuit 142 in that switches switched on/off by the clock signal Φ1 and switches switched on/off by the clock signal Φ2 are switched with each other. A terminal INX2 of the capacitance circuit 142 is connected to the terminal OUTP of the V-I conversion circuit 131 and the terminal IN1 of the amplification circuit 161. A terminal INY2 of the capacitance circuit 142 is connected to the terminal OUTN of the V-I conversion circuit 131 and the terminal IN2 of the amplification circuit 161. A terminal OUTXY2 of the capacitance circuit 142 is connected to a negative power supply voltage VSS. The capacitance circuit 142 is described with reference to FIG. 4. The terminal INX2 is connected to a first terminal of a switch 158 switched on/off by the clock signal Φ2. A second terminal of the switch 158 is connected to the first terminal of the switch 153, the first terminal of the switch 155, and the first terminal of the capacitor 143. The terminal INY2 is connected to a first terminal of a switch 157 switched on/off by the clock signal Φ1. A second terminal of the switch 157 is connected to the first terminal of the switch 154, the first terminal of the switch 156, and the first terminal of the capacitor 146. The rest of the connections are the same as in the first embodiment, and a description on the connections is therefore omitted.

The overall operation of the differential amplification device 101 according to the third embodiment is described with reference to FIG. 9. In FIG. 9, an input voltage applied between the input terminals 111 and 112 is put into the normal phase and the reverse phase alternatingly by the chopper switch circuit 121 switched by the clock signals Φ1 and Φ2. In this state, the input voltage is applied to the capacitance circuit 142 and the amplification circuit 161 switched by the clock signals Φ1 and Φ2, via the V-I conversion circuit 131 in which a DC offset voltage is generated. The input voltage is transmitted in synchronization with the clock signals Φ1 and Φ2, is put into the normal phase state in the amplification circuit 161, and then is supplied to the output terminal 113. The DC offset voltage generated in the downstream of the chopper switch circuit 121 is applied to the capacitance circuit 142 without being switched by the clock signals Φ1 and Φ2, is stored in the capacitors 143 to 146 inside the capacitance circuit while being switched by the clock signals Φ1 and Φ2, and is cancelled out at the time of switching of the clock signals Φ3 and Φ4.

As described above, only an output resulting from the input voltage appears at the output terminal in the differential amplification device according to the third embodiment, and an output resulting from the DC offset voltage does not appear at the output terminal. The obtained differential amplification device is accordingly reduced in DC offset voltage and improved in S/N ratio. When the terminal OUTXY of the capacitance circuit 141 of the first embodiment is connected to an output terminal VOUT, the capacitance circuit 141 can be expected to function as phase compensation capacitors which contribute to the effect of limiting a band based on the Miller effect with respect to the amplification circuit 161, with the result that there can be provided an advantage in that a phase margin is easily secured due to effective band limitation. When the terminal OUTXY2 of the capacitance circuit 142 of the third embodiment is connected to the negative power supply voltage VSS, on the other hand, there is no fear of excessive band limitation which provides an advantage in that quick response is easily ensured, although the Miller effect cannot be expected with respect to the amplification circuit 161.

Fourth Embodiment

Figure 10:
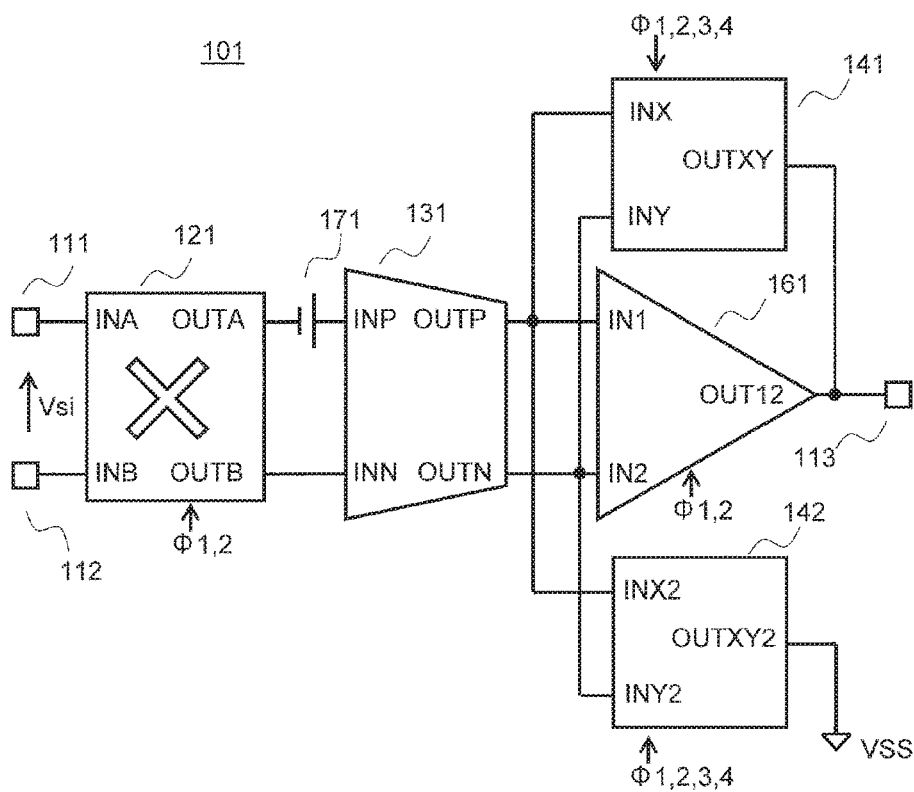
FIG. 10 is a block diagram for illustrating an example of an amplification device according to still another embodiment of the present invention.

A fourth embodiment of the present invention is described below with reference to the drawings. FIG. 10 is a block diagram for illustrating an example of a differential amplification device according to the fourth embodiment of the present invention. The fourth embodiment is an example of using the capacitance circuit 141 and the capacitance circuit 142 both at the same time as illustrated in FIG. 10. In the capacitance circuits 141 and 142, switches switched on/off by the clock signal Φ1 and switches switched on/off by the clock signal Φ2 are switched with each other which means that the output of the V-I conversion circuit 131 is applied to the capacitance circuit 141 and to the capacitance circuit 142 alternatingly. The capacitance circuit 142 in the fourth embodiment works to prevent fluctuations in direct current operating points of the terminals OUTP and OUTN of the V-I conversion circuit 131, even when load fluctuations or the like cause a large amplitude of fluctuations in the voltage V(113) of the output terminal 113. The resultant advantage is that more stable operation can be expected.

According to the present invention, a differential amplification device capable of reducing the DC offset voltage and improved in S/N ratio can be obtained as described above.

What is claimed is:
1. A differential amplification device, comprising:
   a chopper switch circuit configured to switch a polarity of an input signal between a normal phase and a reverse phase;

a V-I conversion circuit configured to convert an output voltage of the chopper switch circuit into a current;

a capacitance circuit directly connected to an output of the V-I conversion circuit; and an amplification circuit directly connected to the output of the V-I conversion circuit, and configured to switch a polarity of an input signal between the normal phase and the reverse phase.

2. A differential amplification device according to claim 1, wherein the capacitance circuit includes a terminal 1, a terminal 2, a terminal 3, a switch 1, a switch 2, a switch 3A, a switch 3B, a switch 4A, a switch 4B, a capacitor 1, a capacitor 2, a capacitor 3, and a capacitor 4, wherein the terminal 1 is connected to a first terminal of the switch 1, wherein the switch 1 includes a second terminal connected to a first terminal of the switch 3A, to a first terminal of the switch 4A, and to a first terminal of the capacitor 1, wherein the switch 3A includes a second terminal connected to a second terminal of the switch 4B and to a first terminal of the capacitor 2, wherein the switch 4A includes a second terminal connected to a second terminal of the switch 3B and to a first terminal of the capacitor 3, wherein the terminal 2 is connected to a first terminal of the switch 2, wherein the switch 2 includes a second terminal connected to a first terminal of the switch 3B, to a first terminal of the switch 4B, and to a first terminal of the capacitor 4, wherein the terminal 3 is connected to a second terminal of the capacitor 1, to a second terminal of the capacitor 2, to a second terminal of the capacitor 3, and to a second terminal of the capacitor 4, wherein on/off operation of the switch 1 and on/off operation of the switch 2 are opposite to each other, and wherein on/off operation of the switch 3A and the switch 3B and on/off operation of the switch 4A and switch 4B are opposite to each other.

3. A differential amplification device according to claim 1, wherein the capacitance circuit is inserted between an input of the amplification circuit and an output of the amplification circuit.

4. A differential amplification device according to claim 2, wherein the capacitance circuit is inserted between an input of the amplification circuit and an output of the amplification circuit.

5. A differential amplification device according to claim 1, wherein the capacitance circuit includes a plurality of capacitance circuits.

6. A differential amplification device according to claim 2, wherein the capacitance circuit includes a plurality of capacitance circuits.

7. A differential amplification device according to claim 3, wherein the capacitance circuit includes a plurality of capacitance circuits.

8. A differential amplification device, comprising:

a chopper switch circuit configured to switch a polarity of an input signal between a normal phase and a reverse phase;

a V-I conversion circuit configured to convert an output voltage of the chopper switch circuit into a current;

a capacitance circuit connected to an output of the V-I conversion circuit; and an amplification circuit connected to the output of the V-I conversion circuit, and configured to switch a polarity of an input signal between the normal phase and the reverse phase;

wherein the capacitance circuit includes a terminal 1, a terminal 2, a terminal 3, a switch 1, a switch 2, a switch 3A, a switch 3B, a switch 4A, a switch 4B, a capacitor 1, a capacitor 2, a capacitor 3, and a capacitor 4, wherein the terminal 1 is connected to a first terminal of the switch 1, wherein the switch 1 includes a second terminal connected to a first terminal of the switch 3A, to a first terminal of the switch 4A, and to a first terminal of the capacitor 1, wherein the switch 3A includes a second terminal connected to a second terminal of the switch 4B and to a first terminal of the capacitor 2, wherein the switch 4A includes a second terminal connected to a second terminal of the switch 3B and to a first terminal of the capacitor 3, wherein the terminal 2 is connected to a first terminal of the switch 2, wherein the switch 2 includes a second terminal connected to a first terminal of the switch 3B, to a first terminal of the switch 4B, and to a first terminal of the capacitor 4, wherein the terminal 3 is connected to a second terminal of the capacitor 1, to a second terminal of the capacitor 2, to a second terminal of the capacitor 3, and to a second terminal of the capacitor 4, wherein on/off operation of the switch 1 and on/off operation of the switch 2 are opposite to each other, and wherein on/off operation of the switch 3A and the switch 3B and on/off operation of the switch 4A and switch 4B are opposite to each other.

9. The differential amplification device according to claim 8, wherein the capacitance circuit is inserted between an input of the amplification circuit and an output of the amplification circuit.

10. The differential amplification device according to claim 8, wherein the capacitance circuit includes a plurality of capacitance circuits.

* * * * *